United States Patent
Kobayashi et al.

(10) Patent No.: US 11,702,592 B2
(45) Date of Patent: Jul. 18, 2023

(54) B-SIALON PHOSPHOR AND LIGHT EMITTING DEVICE

(71) Applicant: DENKA COMPANY LIMITED, Tokyo (JP)

(72) Inventors: Manabu Kobayashi, Omuta (JP); Keita Kobayashi, Omuta (JP); Tomohiro Nomiyama, Omuta (JP); Shintaro Watanabe, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 163 days.

(21) Appl. No.: 17/294,721

(22) PCT Filed: Nov. 7, 2019

(86) PCT No.: PCT/JP2019/043689
§ 371 (c)(1),
(2) Date: May 18, 2021

(87) PCT Pub. No.: WO2020/105456
PCT Pub. Date: May 28, 2020

(65) Prior Publication Data
US 2022/0010205 A1     Jan. 13, 2022

(30) Foreign Application Priority Data
Nov. 19, 2018    (JP) ................ 2018-216183

(51) Int. Cl.
*C09K 11/77* (2006.01)
*H01L 33/50* (2010.01)

(52) U.S. Cl.
CPC ...... *C09K 11/77348* (2021.01); *H01L 33/502* (2013.01)

(58) Field of Classification Search
CPC ................ C09K 11/77348; H01L 33/502
See application file for complete search history.

(56) References Cited

U.S. PATENT DOCUMENTS

| 9,024,519 B2 | 5/2015 | Nonogaki et al. |
| 9,139,769 B2 | 9/2015 | Emoto et al. |
(Continued)

FOREIGN PATENT DOCUMENTS

| CN | 102639672 A | 8/2012 |
| TW | 201412943 A | 4/2014 |
(Continued)

OTHER PUBLICATIONS

Oct. 8, 2022 Office Action Issued in Chinese Patent Application No. 201980075937.6.
(Continued)

*Primary Examiner* — C Melissa Koslow
(74) *Attorney, Agent, or Firm* — Oliff PLC (57) ABSTRACT

A β-sialon phosphor that is a solid solution of europium, in which $D_{50}$ is 7.0 μm or more and 20.0 μm or less and $(D_{50}-D_{10})/D_{50}$ is 0.60 or less, where $D_{50}$ is a 50% area diameter of primary particles of the β-sialon phosphor, and $D_{10}$ is a 10% area diameter of the primary particles of the β-sialon phosphor. Primary particles are defined as single-crystal particles distinguished for each crystal orientation by identifying the crystal orientation of individual particles of the β-sialon phosphor by an electron backscatter diffraction image method. $D_{50}$ and $D_{10}$ are obtained by image analysis of the cross-sectional area of the primary particles.

7 Claims, 3 Drawing Sheets

(56) References Cited

U.S. PATENT DOCUMENTS

| | | |
|---|---|---|
| 9,631,140 B2 | 4/2017 | Yoshimura et al. |
| 2012/0228551 A1 | 9/2012 | Emoto et al. |
| 2012/0313507 A1* | 12/2012 | Hashimoto ....... C04B 35/62685 |
| | | 423/325 |
| 2013/0293093 A1 | 11/2013 | Nonogaki et al. |
| 2015/0357529 A1 | 12/2015 | Yoshimura et al. |
| 2019/0062631 A1 | 2/2019 | Kobayashi et al. |

FOREIGN PATENT DOCUMENTS

| | | |
|---|---|---|
| WO | 2012/011444 A1 | 1/2012 |
| WO | 2012/101899 A1 | 8/2012 |
| WO | 2014/115447 A1 | 7/2014 |
| WO | 2017/122800 A1 | 7/2017 |

OTHER PUBLICATIONS

Feb. 4, 2020 International Search Report issued in International Patent Application No. PCT/JP2019/043689.

\* cited by examiner

β-SIALON PHOSPHOR AND LIGHT EMITTING DEVICE

TECHNICAL FIELD

The present invention relates to a β-sialon phosphor and a light emitting device.

BACKGROUND ART

A light emitting device that combines a light emitting element that emits primary light and a phosphor that absorbs primary light and emits secondary light, is known.

In recent years, β-sialon phosphor having stable crystal structures have attracted attention as demands for heat resistance and durability of phosphors have increased due to an increase in the output of light emitting devices.

A phosphor in which $Eu^{2+}$ is solid-dissolved in the crystal structure of β-sialon is a phosphor which is excited by ultraviolet to blue light and emits green light at 520 to 550 nm. The β-sialon in which $Eu^{2+}$ is solid-dissolved is also called the Eu-solid-dissolved β-sialon. This phosphor is used as a green light emitting component of a light emitting device such as a white light emitting diode (referred to as white LED). The Eu-solid-dissolved β-sialon has a very sharp emission spectrum among phosphors in which $Eu^{2+}$ is solid-dissolved, and is particularly suitable for phosphors for a green light emitting component of a backlight source of a liquid crystal display panel requiring narrow-band emission composed of three primary colors of blue, green and red light.

Examples of the technique related to such a β-sialon phosphor include those described in Patent Document 1 below.

Patent Document 1 (International Publication No. WO 2012/011444) discloses a Eu-solid-dissolved β-sialon represented by general formula: $Si_{6-z}Al_zO_zN_{8-z}$ (0<Z≤0.42), in which Eu is solid-dissolved, in which a 50% area diameter of primary particles of the β-sialon is 5 μm or more.

RELATED DOCUMENT

Patent Document

[Patent Document 1] International Publication No. WO 2012/011444

SUMMARY OF THE INVENTION

Technical Problem

Further improvement in luminance is required for β-sialon phosphors and light emitting devices.

The present invention has been made in view of the above circumstances. The present invention provides a β-sialon phosphor and a light emitting device having improved luminance.

Solution to Problem

The present inventors have made extensive studies to provide a β-sialon phosphor and a light emitting device having improved luminance. As a result, it has been found that the luminance of the β-sialon phosphor and the light emitting device using the β-sialon phosphor can be improved by setting $D_{50}$ and $(D_{50}-D_{10})/D_{50}$ described below to specific ranges, respectively, and the present invention has been achieved.

That is, according to the present invention, the following β-sialon phosphor and light emitting device are provided.

1.
A β-sialon phosphor that is a solid solution of europium,
in which, when single-crystal particles distinguished for each crystal orientation by identifying the crystal orientation of individual particles of the β-sialon phosphor by an electron backscatter diffraction image method are defined as primary particles,
$D_{50}$ is 7.0 μm or more and 20.0 μm or less and $(D_{50}-D_{10})/D_{50}$ is 0.60 or less, where $D_{50}$ is a 50% area diameter of the primary particles of the β-sialon phosphor, and $D_{10}$ is a 10% area diameter of the primary particles of the β-sialon phosphor, when a cross-sectional area of the primary particles is determined by image analysis.

2.
The β-sialon phosphor according to 1., in which $(D_{90}-D_{10})/D_{50}$ is 1.45 or less, where $D_{90}$ is a 90% area diameter of the primary particles of the β-sialon phosphor.

3.
The β-sialon phosphor according to 1. or 2.,
in which the β-sialon phosphor is represented by general formula $Si_{6-z}Al_zO_zN_{8-z}:Eu^{2+}$ (0<Z≤4.2).

4.
The β-sialon phosphor according to any one of 1. to 3.,
in which a $D_{V50}$ particle size (diameter at 50% cumulative volume in particle size distribution by a laser diffraction scattering method in accordance with JIS R1629:1997) of the β-sialon phosphor is 5 μm or more and 50 μm or less.

5.
The β-sialon phosphor according to any one of 1. to 4.,
in which, when particles in which a plurality of the primary particles are sintered via grain boundaries are defined as secondary particles,
a ratio of the number of the primary particles to the number of the secondary particles of the β-sialon phosphor is 1.90 or less.

6.
A light emitting device including a light emitting light source and a wavelength conversion member,
in which the wavelength conversion member contains a phosphor, and
the phosphor contains the β-sialon phosphor according to any one of 1. to 5.

7.
The light emitting device according to 6.,
in which the light emitting light source includes an LED chip that generates light having a wavelength of 300 nm to 500 nm.

8.
The light emitting device according to 6. or 7.,
in which the phosphor further contains a manganese-solid-dissolved KSF-based phosphor.

Advantageous Effects of Invention

According to the present invention, it is possible to provide a β-sialon phosphor and a light emitting device having improved luminance.

BRIEF DESCRIPTION OF THE DRAWINGS

The object described above and other objects, features and advantages will be further clarified by the preferred embodiments described below and the accompanying drawings.

DESCRIPTION OF EMBODIMENTS

Hereinafter, embodiments of the present invention will be described with reference to the drawings, but the present invention should not be construed as being limited to these, and various changes, improvements, and the like can be made based on those skilled in the art, as long as it does not deviate from the gist of the present invention. Various inventions can be formed by appropriately combining a plurality of constituent elements disclosed in the embodiments. For example, some constituent elements may be deleted from all the constituent elements shown in the embodiments, or constituent elements of different embodiments may be appropriately combined.

The drawings are schematic and do not necessarily correspond to actual dimensional ratios.

Unless otherwise specified, "A to B" in the numerical range represent A or more and B or less.

(β-Sialon Phosphor)

A β-sialon phosphor of the present embodiment is a β-sialon phosphor that is a solid solution of europium, in which $D_{50}$ is 7.0 μm or more and 20.0 μm or less and $(D_{50}-D_{10})/D_{50}$ is 0.60 or less, where $D_{50}$ is a 50% area diameter of primary particles of the β-sialon phosphor, and $D_{10}$ is a 10% area diameter of the primary particles of the β-sialon phosphor.

Here, "primary particles" are defined as single-crystal particles distinguished for each crystal orientation by identifying the crystal orientation of individual particles of the β-sialon phosphor by an electron backscatter diffraction image method. Further, $D_{50}$ and $D_{10}$ are obtained by image analysis of the cross-sectional area of the primary particles. The specific measurement method and the like will be described later.

The β-sialon phosphor according to the present embodiment is a phosphor made of $Eu^{2+}$-solid-dissolved β-sialon represented by general formula $Si_{6-z}Al_zO_zN_{8-z}:Eu^{2+}$ (0<Z≤4.2). Hereinafter, an europium-solid-dissolved β-sialon is also simply referred to as β-sialon.

In general formula $Si_{6-z}Al_zO_zN_{8-z}:Eu^{2+}$, the Z value and the content of europium are not particularly limited, but the Z value is, for example, more than 0 and 4.2 or less, and is preferably 0.005 or more and 1.0 or less from the viewpoint of further improving the light emitting intensity of the β-sialon phosphor. Further, the content of europium is preferably 0.1% by mass or more and 2.0% by mass or less.

The β-sialon phosphor is one in which a plurality of particles are strongly integrated during the heat treatment in the firing step, and each one of the plurality of particles is called a primary particle, and the plurality of particles strongly integrated is called a secondary particle. More specifically, the primary particles can be defined as single-crystal particles distinguished for each crystal orientation by identifying the crystal orientation of individual particles of the β-sialon phosphor by an electron backscatter diffraction image method, as described above. Further, the secondary particles can be defined as particles in which a plurality of primary particles are sintered via grain boundaries.

According to the β-sialon phosphor according to the present embodiment, when the primary particles of the β-sialon phosphor $D_{50}$ and $(D_{50}-D_{10})/D_{50}$ are within the above ranges, the light emitting intensity, that is, the luminance can be improved.

The reason for this is not necessarily clear, but the following reasons may be inferred.

It is considered that when the particle size of the primary particles of the β-sialon phosphor is large, the proportion of impurities present at the crystal grain boundaries is reduced and the crystallinity is improved, so that the luminous efficiency can be improved. Therefore, when $D_{50}$ and $(D_{50}-D_{10})/D_{50}$ of the primary particles of the β-sialon phosphor are within the above ranges, the proportion of β-sialon particles having a small particle size of the primary particles and low luminous efficiency becomes relatively low, and the proportion of β-sialon particles have a large particle size of primary particles and high luminous efficiency becomes relatively large. As a result, it is considered that the light emitting intensity of the β-sialon phosphor can be improved.

For the above reasons, according to the present embodiment, it is possible to provide a β-sialon phosphor and a light emitting device having improved luminance.

In the present embodiment, the $D_{50}$ and $(D_{50}-D_{10})/D_{50}$ of the primary particles of the β-sialon phosphor can be achieved by, for example, carrying out the firing step by adding a europium compound, which is one of the raw materials of the β-sialon phosphor, in two or more portions, and adding a larger amount of the europium compound in the second firing step than in the conventional process.

The 50% area diameter $D_{50}$ of the primary particles of the β-sialon phosphor according to the present embodiment is 7.0 μm or more and 20.0 μm or less, but is preferably 9.0 μm or more, and preferably 18.0 μm or less, and more preferably 15.0 μm or less.

Further, $(D_{50}-D_{10})/D_{50}$ is 0.60 or less, preferably 0.55 or less, more preferably 0.53 or less, and still more preferably 0.51 or less. This makes it possible to reduce the difference in characteristics between β-sialon particles. As a result, the light emission characteristics and color variations of the obtained light emitting device can be reduced.

In the β-sialon phosphor according to the present embodiment, from the viewpoint of further improving the light emitting intensity of the β-sialon phosphor, when the 90% area diameter of the primary particles of the β-sialon phosphor is $D_{90}$, $(D_{90}-D_{10})/D_{50}$ is preferably 1.45 or less, and more preferably 1.35 or less. Further, when $(D_{90}-D_{10})/D_{50}$ is the above upper limit value or less, the difference in characteristics between β-sialon particles can be reduced. As a result, the light emission characteristics and color variations of the obtained light emitting device can be reduced.

The 50% area diameter $D_{50}$, the 10% area diameter $D_{10}$, and the 90% area diameter $D_{90}$ of the primary particles will be described more specifically.

Assume that there is a group of primary particles in which individual primary particles, that is, single-crystal particles, of β-sialon phosphors, are arranged in order of decreasing cross-sectional area as $C_{A1}, C_{A2}, C_{A3}, \ldots, C_{Ai}, \ldots, C_{Ak}$. The term "primary particles" as used herein means all single-crystal particles, and includes, without distinction, those in which a plurality of primary particles are sintered via grain boundaries to constitute secondary particles and those in which secondary particles are not constituted. When the cumulative curve is obtained by taking the sum of the cross-sectional areas of the group of primary particles ($C_{A1}$+

$C_{A2}+C_{A3}+\ldots+C_{Ai}+\ldots+C_{Ak}$) as 100%, the primary particle sizes calculated from the cross-sectional areas ($S_{50}$, $S_{10}$, $S_{90}$) of the primary particles at points corresponding to 50%, 10%, and 90% of the cumulative curve are taken as the 50% area diameter $D_{50}$, the 90% area diameter $D_{90}$, and the 10% area diameter $D_{10}$ of the primary particles, respectively.

Specific methods for obtaining the 50% area diameter $D_{50}$, the 10% area diameter $D_{10}$ and the 90% area diameter $D_{90}$ of the primary particles will be described. In order to obtain the area diameter, it is necessary to measure the cross-sectional area of the primary particles and create a cumulative curve.

The cross-sectional area of the particles can be measured by using an electron backscatter diffraction image method (hereinafter, also referred to as an EBSD method).

Figure 1:
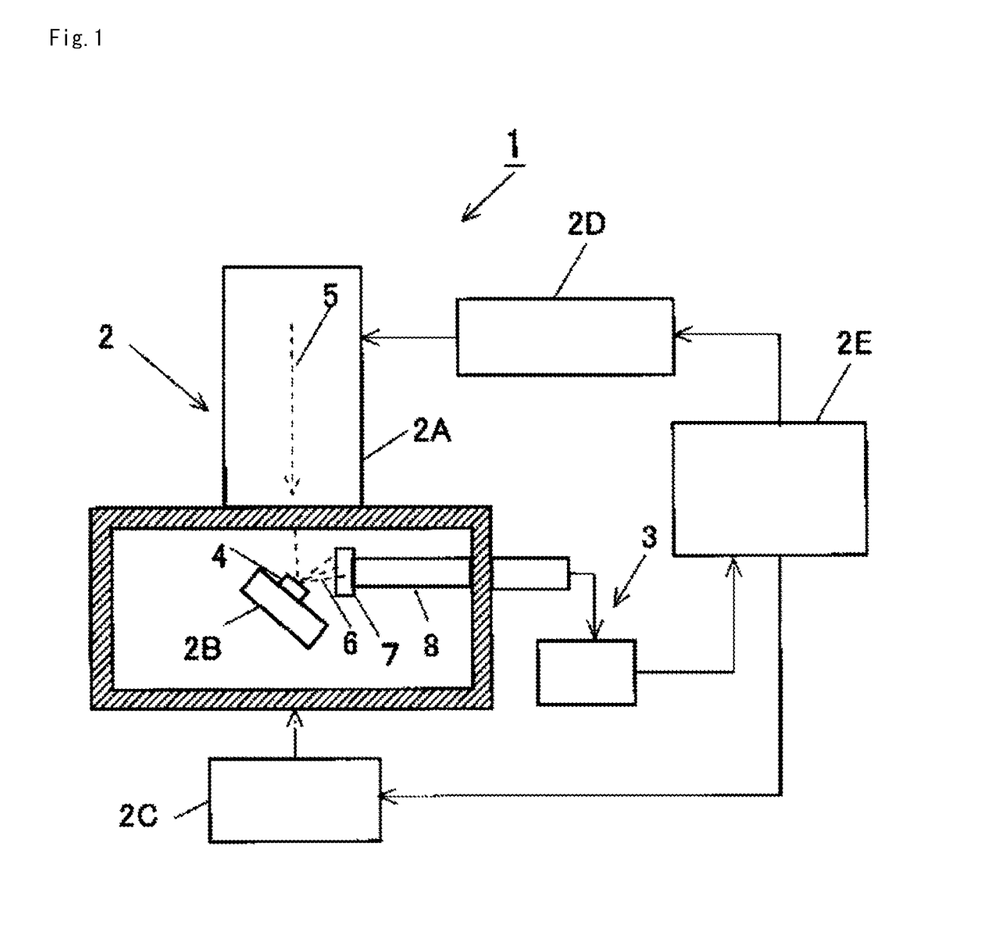
FIG. 1 is a schematic diagram showing a configuration of an apparatus used for measurement using an EBSD method.

FIG. 1 is a schematic diagram showing a configuration of an apparatus used for measurement using an EBSD method.

As shown in FIG. 1, an apparatus 1 used for the EBSD method is constituted from an apparatus in which a scanning electron microscope 2 is added with an electron backscatter diffraction image measuring apparatus 3. The scanning electron microscope 2 includes a lens barrel portion 2A, a stage portion 2B on which a sample 4 is placed, a stage control portion 2C, an electron beam scanning portion 2D, a control computer 2E, and the like. The electron backscatter diffraction image measuring apparatus 3 includes a fluorescent screen 7 for detecting electrons 6 generated by irradiating the sample 4 with an electron beam 5 and scattered backward, and a camera 8 for capturing a fluorescent image of the fluorescent screen 7, software (not shown) for acquiring and analyzing data of an electron backscatter diffraction image, and the like.

Using this apparatus, β-sialon phosphor as the sample 4 is irradiated with an electron beam to cause electron scattering corresponding to the crystal structure and crystal plane, and the shape of the electron scattering pattern is analyzed by software. More specifically, the crystal orientations of the individual phosphor particles are identified, and the cross-sectional area of the primary particles that can be distinguished for each individual crystal orientation is obtained by image analysis. Next, from the obtained cross-sectional areas, a cumulative curve is created as described above, and the cross-sectional areas of the primary particles at the points corresponding to 50%, 10%, and 90% ($S_{50}$, $S_{10}$, $S_{90}$) are obtained, and using these values, the 50% area diameter $D_{50}$, the 10% area diameter $D_{10}$, and the 90% area diameter $D_{90}$ of the primary particles corresponding to the diameters when converted into a circle are respectively calculated from equations (1), (2), and (3) below.

$$50\% \text{ area diameter of primary particles} = 2\times(S_{50}/\pi)^{1/2} \quad (1)$$

In the formula, $S_{50}$ is the area of the primary particle at the point where the cumulative curve of the areas of individual primary particles is 50%.

$$10\% \text{ area diameter of primary particles} = 2\times(S_{10}/\pi)^{1/2} \quad (2)$$

In the formula, $S_{10}$ is the area of the primary particle at the point where the cumulative curve of the areas of individual primary particles is 10%.

$$90\% \text{ area diameter of primary particles} = 2\times(S_{90}/\pi)^{1/2} \quad (3)$$

In the formula, $S_{90}$ is the area of the primary particle at the point where the cumulative curve of the areas of individual primary particles is 90%.

From the viewpoint of improving the dispersed state in the resin and suppressing color variation and decrease in luminance of a light emitting device such as an LED manufactured by using β-sialon phosphor, $D_{V50}$ particle size (50% volume diameter) of the β-sialon phosphor according to the present embodiment is preferably 50 μm or less, more preferably 40 μm or less, and still more preferably 30 μm or less.

Further, the $D_{V50}$ particle size (50% volume diameter) of the β-sialon phosphor according to the present embodiment is preferably 5 μm or more, and more preferably 10 μm or more. This makes it possible to improve the luminous efficiency of the β-sialon phosphor and improve the luminance by suppressing light scattering.

Here, in the present embodiment, the "$D_{V50}$ particle size (50% volume diameter)" means a 50% cumulative volume in particle size distribution by a laser diffraction scattering method in accordance with JIS R1629:1997. Note that the definition and measurement method of the $D_{V50}$ particle size (50% volume diameter) is different from the definition and measurement method of $D_{50}$, $D_{10}$, and $D_{90}$.

Further, the smaller the number of primary particles in the secondary particles of the β-sialon phosphor, the higher the luminous efficiency. The ratio of the number of primary particles to the number of secondary particles of the β-sialon phosphor is calculated by counting the number of secondary particles in the image of the β-sialon obtained by the EBSD method and the number of primary particles constituting the secondary particles and taking the ratio of the number of primary particles to the number of secondary particles. The ratio of the number of primary particles to the number of secondary particles, that is, the number of primary particles in the secondary particles, of the β-sialon phosphor, is preferably 1.90 or less, more preferably 1.80 or less, still more preferably 1.70 or less, and further preferably 1.60 or less.

Further, when the ratio of the number of primary particles to the number of secondary particles of the β-sialon phosphor is the above upper limit value or less, the difference in characteristics between the β-sialon particles can be reduced, and as a result, the light emission characteristics and color variations of the obtained light emitting device can be reduced.

The β-sialon according to the present embodiment is excited in a wide wavelength range from ultraviolet rays to visible light, and emits green light having a main wavelength in the range of 520 nm or more and 550 nm or less with high efficiency. Therefore, it is excellent as a green light-emitting phosphor.

Further, the β-sialon phosphor according to the present embodiment can be suitably used as a material for the phosphor layer in the light emitting element. The light emitting element can be applied to a light emitting device such as a backlight source of a display or a lighting device. The light emitting element is not particularly limited, but includes, for example, an LED and a phosphor layer laminated on the light emitting surface side of the LED. As the LED, an ultraviolet LED or a blue LED that emits light having a wavelength of 300 to 500 nm, particularly a blue LED that emits light having a wavelength of 440 to 480 nm can be used. In particular, since the β-sialon phosphor obtained by the production method according to the present embodiment is excited at a wide wavelength from ultraviolet to blue light and exhibits a high luminance green emission, it can be suitably used as a phosphor for a white LED using blue or ultraviolet light as a light source.

(Method for Production β-Sialon Phosphor)

Next, a method for producing a β-sialon phosphor according to the present embodiment will be described.

The method for producing a β-sialon phosphor according to the present embodiment is different from conventional methods for producing a β-sialon phosphor. That is, the β-sialon phosphor in which the 50% area diameter $D_{50}$ and $(D_{50}-D_{10})/D_{50}$ of the primary particles are within the above ranges can be obtained only by adopting the points in the production method including carrying out the firing step by adding a europium compound, which is one of the raw materials of the β-sialon phosphor, in two or more portions, and adding a larger amount of the europium compound in the second firing step than in the conventional process.

However, for the β-sialon phosphor according to the present embodiment, for example, various other specific production conditions can be adopted on the premise that the above-described points in the production method are adopted.

Hereinafter, a method for producing a β-sialon phosphor according to the present embodiment will be described in more detail.

The method for producing a β-sialon phosphor according to the present embodiment includes at least the following two firing steps. That is, the method for producing a β-sialon phosphor according to the present embodiment includes a first firing step of firing a first raw material powder containing a first europium compound to obtain a first fired powder containing β-sialon particles, and a second firing step of firing the obtained first fired powder and a second raw material powder containing a second europium compound to obtain the β-sialon phosphor according to the present embodiment.

Here, in the second firing step, the second europium compound is added in a larger amount than the conventional standard. More specifically, in the second firing step, the second europium compound is added so that the amount of Eu exceeds the amount of Eu that can be solid-dissolved in β-sialon.

By adding the second europium compound so that the amount of Eu exceeds the amount of Eu that can be solid-dissolved in β-sialon in the second firing step, a liquid phase is formed during the firing of the β-sialon particles in the second firing step, and the primary particles of β-sialon particles having a small particle size can be further coarsened. This makes it possible to adjust the 50% area diameter $D_{50}$ and $(D_{50}-D_{10})/D_{50}$ of the primary particles of the β-sialon phosphor within the above range.

Further, this method for producing a β-sialon phosphor may further include a third firing step of further firing the second fired powder to obtain a third fired powder, which may be performed one or more times. At that time, a europium compound may be further added.

Here, in the present embodiment, the "first firing step" means a first firing step in which a raw material powder containing a first europium compound is heat-treated, the "second firing step" means a second firing step in which a second europium compound is added and heat-treated, and the "third firing step" means a firing step performed after the second firing step.

Further, in the present embodiment, the "first europium compound" means the europium compound added in the first firing step, and the "second europium compound" means a europium compound added in the second firing step.

Further, in the present embodiment, the "first raw material powder" means a raw material powder used in the first firing step, and the "second raw material powder" is a raw material powder used in the second firing step. It is preferable that each raw material powder is mixed.

Further, in the present embodiment, the "first fired powder" means a product obtained in the first firing step, the "second fired powder" means a product obtained in the second firing step, and the "third fired powder" means a product obtained in the third firing step.

In the present embodiment, the term "step" includes not only independent steps but also steps that cannot be clearly distinguished from other steps as long as the intended purpose of the step is achieved.

Further, the content of europium in the composition means, when a plurality of substances corresponding to europium are present in the composition, the total amount of the plurality of substances present in the composition unless otherwise specified.

The first raw material powder preferably contains silicon nitride and aluminum nitride in addition to the first europium compound. The silicon nitride and aluminum compounds are materials for forming the skeleton of β-sialon, and the europium compound is a material for forming an emission center.

In addition, the first raw material powder may further contain β-sialon. β-sialon is a material serving as an aggregate or core material.

The form of each of the above components contained in the first raw material powder is not particularly limited, but it is preferable that they are all in the form of powder.

The europium compound is not particularly limited, and examples thereof include an oxide containing europium, a hydroxide containing europium, a nitride containing europium, an oxynitride containing europium, and a halide containing europium. These can be used alone or in combination of two or more. Among them, europium oxide, europium nitride and europium fluoride are preferably used alone, and europium oxide is more preferably used alone.

The europium compound is added separately before firing in a plurality of firing steps. Specifically, the europium compound is added before the first firing step and the second firing step, respectively.

In each firing step, europium is divided into those that are solid-dissolved in β-sialon, those that volatilize, and those that remain as a heterophase component. The heterophase component containing europium can be removed by acid treatment or the like, but if it is produced in an excessively large amount, an insoluble component is produced by acid treatment and the luminance is lowered. Further, as long as it is a heterophase that does not absorb excess light, it may be in a residual state, and europium may be contained in this heterophase. When the europium compound is added before firing in a plurality of firing steps, a β-sialon phosphor raw material other than the europium compound may be added together with the europium compound.

In the method for producing a β-sialon phosphor according to the present embodiment, when the total of the first fired powder and the second europium compound is 100% by mass, the ratio of the second europium compound is preferably 1.0% by mass or more, more preferably 2.0% by mass or more, and still more preferably 3.0% by mass or more, from the viewpoint of more effectively removing Eu that does not contribute to the luminance improvement of the β-sialon phosphor and further improving the luminance of the obtained β-sialon phosphor, and the ratio of the second europium compound is preferably 18.0% by mass or less, more preferably 17.0% by mass or less, and still more preferably 15.0% by mass or less, from the viewpoint of reducing the amount of insoluble heterophase components generated by the acid treatment and further improving the luminance of the obtained β-sialon phosphor.

Further, in the method for producing a β-sialon phosphor according to the present embodiment, when the ratio of the second europium compound is within the above range, Eu that does not contribute to the luminance improvement of the β-sialon phosphor can be removed more effectively, and at the same time, it is possible to suppress the generation of insoluble heterophase components by acid treatment. Therefore, the production process of removing the heterophase component or the like can be simplified, and as a result, the production time of the β-sialon phosphor can be shortened.

The total amount of europium contained in the first raw material powder and the second raw material powder is not particularly limited, but is preferably 3 times or more the amount of europium solid-dissolved in the finally obtained β-sialon phosphor, and more preferably 4 times or more.

Further, the total amount of europium contained in the first raw material powder and the second raw material powder is not particularly limited, but is preferably 18 times or less the amount of europium solid-dissolved in the finally obtained β-sialon phosphor.

This makes it possible to reduce the amount of insoluble heterophase components generated by the acid treatment. In addition, the luminance of the obtained β-sialon phosphor can be further improved.

The amount of europium contained in the first raw material powder is not particularly limited, but it is preferably larger than the amount of europium solid-dissolved in the finally obtained β-sialon phosphor.

Further, the amount of europium contained in the first raw material powder is preferably 3 times or less the amount of europium solid-dissolved in the finally obtained β-sialon phosphor. This makes it possible to reduce the amount of insoluble heterophase components generated by the acid treatment. In addition, the luminance of the obtained β-sialon phosphor can be further improved.

In each firing step, the raw material powder containing the europium compound can be obtained by, for example, a method of dry mixing, a method of wet mixing in an inert solvent that does not substantially react with each component of the raw material, and then removing the solvent. The mixing device is not particularly limited, but for example, a V-type mixer, a locking mixer, a ball mill, a vibration mill, or the like can be used.

The firing temperature in each firing step is not particularly limited, but is preferably in the range of 1800° C. or more and 2100° C. or less.

When the firing temperature is the above lower limit value or more, the grain growth of the β-sialon phosphor proceeds more effectively. Therefore, the light absorption rate, the internal quantum efficiency, and the external quantum efficiency can be further improved.

When the firing temperature is the above upper limit value or less, the decomposition of the β-sialon phosphor can be further suppressed. Therefore, the light absorption rate, the internal quantum efficiency, and the external quantum efficiency can be further improved.

Other conditions such as the heating time, the heating rate, the heating holding time, and the pressure in each firing step are not particularly limited, and may be appropriately adjusted according to the raw materials used. Typically, the heating holding time is preferably 3 to 30 hours, and the pressure is preferably 0.6 to 10 MPa.

In each firing step, as a method for firing the mixture, for example, a method of filling the mixture in a container made of a material that does not react with the mixture during firing (for example, boron nitride) and heating in a nitrogen atmosphere can be used. By using such a method, a crystal growth reaction, a solid solution reaction, or the like can be advanced to obtain a β-sialon phosphor.

The first fired powder and the second fired powder are granular or lumpy sintered bodies. The granular or lumpy sintered body can be made into a β-sialon phosphor having a predetermined size by using treatments such as crushing, pulverization, classification, or the like alone or in combination.

Specific examples of the treatment method include a method of pulverizing the sintered body to a predetermined particle size using a general pulverizer such as a ball mill, a vibration mill, or a jet mill. However, it should be noted that excessive pulverization not only produces fine particles that easily scatter light, but also causes crystal defects on the particle surface, and thus may cause a decrease in the luminous efficiency of β-sialon. In addition, this treatment may be performed after the acid treatment or the alkali treatment described later.

The method for producing a β-sialon phosphor according to the present embodiment may further include, after the second firing step, an annealing step of heating the second fired powder at a temperature lower than the firing temperature of the second firing step to obtain an annealed product.

This annealing step is preferably performed in an inert gas such as a rare gas and a nitrogen gas, a reducing gas such as a hydrogen gas, a carbon monoxide gas, a hydrocarbon gas, and an ammonia gas, or a mixed gas thereof, or in a non-oxidizing atmosphere other than pure nitrogen such as a vacuum, and particularly preferably in a hydrogen gas atmosphere or an argon atmosphere.

Further, the annealing step may be performed under atmospheric pressure or pressurization. The heat treatment temperature in the annealing step is not particularly limited, but is preferably 1200 to 1700° C., and more preferably 1300° C. to 1600° C.

By performing this annealing step, the luminous efficiency of the β-sialon phosphor can be further improved. Further, the rearrangement of the elements removes strains and defects, so that transparency can also be improved. In the annealing step, a heterophase may be generated, but this can be removed by an acid treatment or the like described later.

Further, before the annealing step, the compound of the element constituting the β-sialon phosphor may be added and mixed. The compound to be added is not particularly limited, and examples thereof include an oxide, a nitride, an oxynitride, a fluoride, and a chloride of each element. In particular, by adding silica, aluminum oxide, europium oxide, europium fluoride, or the like to each heat-treated product, the luminance of the β-sialon phosphor can be further improved. However, it is desirable that the undissolved residue of the raw material to be added can be removed by acid treatment, alkali treatment, or the like after the annealing step.

In the method for producing a β-sialon phosphor according to the present embodiment, a step of performing an acid treatment, an alkali treatment, and/or a fluorine treatment on the second fired powder or the annealed product of the second fired powder may be further performed.

Here, the acid treatment or the alkaline treatment is a treatment in which, for example, an acidic or alkaline liquid is brought into contact with the second fired powder or the annealed product of the second fired powder. The fluorine treatment is, for example, a step of bringing a gas containing fluorine into contact with a second fired powder or an annealed product of the second fired powder.

By performing such a step, it is possible to dissolve and remove the heterophase component (luminescence inhibitor) generated in the firing step, the annealing step, and the like. Therefore, the light absorption rate, the internal quantum efficiency, and the external quantum efficiency of the β-sialon phosphor can be further improved.

As the acidic liquid, for example, an aqueous solution containing one or more acids selected from hydrofluoric acid, sulfuric acid, phosphoric acid, hydrochloric acid, and nitric acid can be used. As the alkaline liquid, for example, an aqueous solution containing one or more alkalis selected from potassium hydroxide, aqueous ammonia, and sodium hydroxide can be used. However, it is more preferably an acidic aqueous solution, and particularly preferably a mixed aqueous solution of hydrofluoric acid and nitric acid.

The treatment method using an acidic or alkaline liquid is not particularly limited, and the treatment can be performed by dispersing the second fired powder or an annealed product of the second fired powder in the aqueous solution containing an acid or an alkali described above, and stirring and reacting the second fired powder or the annealed product for about several minutes to several hours (for example, 10 minutes to 6 hours). After this treatment, it is desirable to separate substances other than the β-sialon phosphor by filtration and wash the substances adhering to the β-sialon phosphor with water.

(Light Emitting Device)

Hereinafter, a light emitting device using the β-sialon phosphor according to the present embodiment will be described in detail.

The light emitting device according to the present embodiment is a light emitting device including a light emitting light source and a wavelength conversion member, the wavelength conversion member contains a phosphor, and the phosphor contains the β-sialon phosphor according to the present embodiment.

Figure 2:
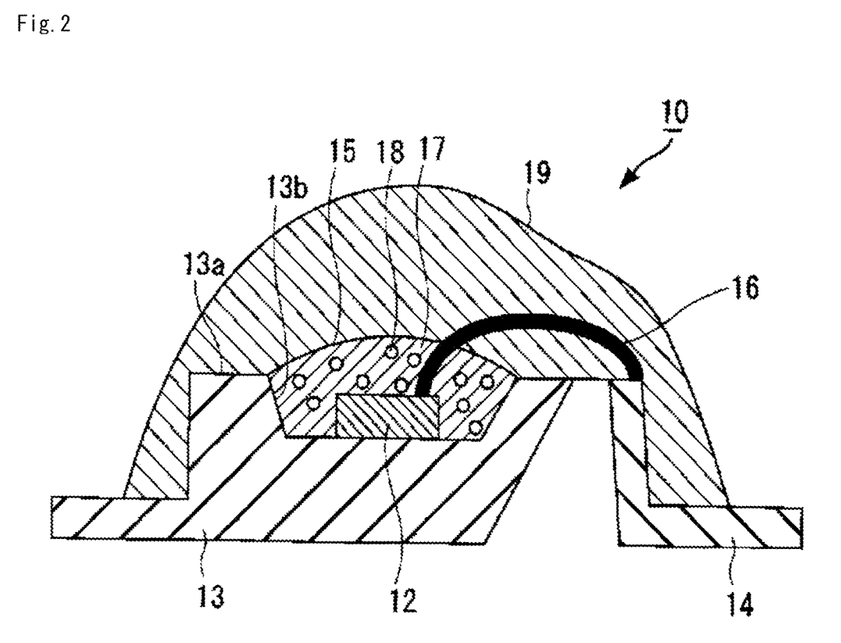
FIG. 2 is a cross-sectional view schematically showing an example of a structure of a light emitting device according to an embodiment of the present invention.

FIG. 2 is a cross-sectional view schematically showing an example of a structure of a light emitting device 10 according to an embodiment of the present invention.

The light emitting device 10 shown in FIG. 2 includes an LED chip as a light emitting light source 12, a first lead frame 13 on which the light emitting light source 12 is mounted, a second lead frame 14, a wavelength conversion member 15 that covers the light emitting light source 12, a bonding wire 16 that electrically connects the light emitting light source 12 and the second lead frame 14, and a cap 19 made of synthetic resin that covers these. The wavelength conversion member 15 has a phosphor 18 and a sealing resin 17 in which the phosphor 18 is dispersed.

On an upper portion 13a of the first lead frame 13, a recess portion 13b is formed for mounting a light emitting diode chip as the light emitting light source 12. The recess portion 13b has a substantially funnel shape in which the hole diameter gradually expands upward from the bottom surface thereof, and the inner surface of the recess portion 13b serves as a reflective surface. An electrode on the lower surface side of the light emitting light source 12 is die-bonded to a bottom surface of the reflective surface. Another electrode formed on an upper surface of the light emitting light source 12 is connected to a surface of the second lead frame 14 via the bonding wire 16.

Various LED chips can be used as the light emitting light source 12. Particularly preferred is an LED chip that generates light having a wavelength of blue light from near ultraviolet of 300 nm to 500 nm.

The phosphor 18 used for the wavelength conversion member 15 of the light emitting device 10 includes the β-sialon phosphor according to the present embodiment. Further, from the viewpoint of controlling the light wavelength control of the light emitting device 10, the phosphor 18 may further contain a phosphor such as an α-sialon phosphor, a KSF-based phosphor, a single substance or a mixture of $CaAlSiN_3$ or YAG in addition to the β-sialon phosphor according to the present embodiment. Examples of the element solid-dissolved in these phosphors include europium (Eu), cerium (Ce), strontium (Sr), calcium (Ca), and manganese (Mn). These phosphors may be used alone or in combination of two or more.

Among these, the phosphor used in combination with the β-sialon phosphor according to the present embodiment is preferably a manganese-solid-dissolved KSF-based phosphor. By using the β-sialon phosphor according to the present embodiment showing green color and the KSF-based phosphor showing red color in combination, it can be suitably used as a backlight LED suitable for a high color rendering TV, for example.

By combining the light emitting light source 12 and the wavelength conversion member 15, light having a high light emitting intensity can be emitted.

In the case of the light emitting device 10 using the β-sialon phosphor according to the present embodiment, by irradiating the light emitting light source 12 with near-ultraviolet light or visible light containing a wavelength of 300 nm or more and 500 nm or less as an excitation source, the light emitting device 10 has green light emission characteristics having peaks at wavelengths in the range of 520 nm or more and 550 nm or less. Therefore, by using a near-ultraviolet LED chip or a blue LED chip as the light emitting light source 12 and the β-sialon phosphor according to the present embodiment, and further combining a single substance or a mixture of a red light emitting phosphor, a blue light emitting phosphor, a yellow light emitting phosphor, or an orange light emitting phosphor having wavelengths of 600 nm or more and 700 nm or less, white light can be obtained.

Since the light emitting device 10 of the present invention contains a β-sialon phosphor having improved light emitting intensity, the luminance can be improved.

Although the embodiments of the present invention have been described above, these are examples of the present invention, and various configurations other than the above can be adopted.

The present invention is not limited to the above-described embodiments. The present invention includes modifications, improvements and the like to the extent that the objects of the present invention can be achieved.

Reference forms of the present invention will be additionally described below.

[1]

A β-sialon phosphor that is a solid solution of europium, in which $D_{50}$ is 7.0 µm or more and 20.0 µm or less and $(D_{50}-D_{10})/D_{50}$ is 0.60 or less, where $D_{50}$ is a 50% area diameter of primary particles of the β-sialon phosphor, and $D_{10}$ is a 10% area diameter of the primary particles of the β-sialon phosphor.

[2]

The β-sialon phosphor according to the above [1], in which $(D_{90}-D_{10})/D_{50}$ is 1.45 or less, where $D_{90}$ is a 90% area diameter of the primary particles of the β-sialon phosphor.

[3]

The β-sialon phosphor according to the above [1] or [2], in which the β-sialon phosphor is represented by general formula $Si_{6-z}Al_zO_zN_{8-z}:Eu^{2+}$ ($0<Z\leq4.2$).

[4]

The β-sialon phosphor according to any one of the above [1] to [3], in which a $D_{V50}$ particle size (50% volume diameter) of secondary particles of the β-sialon phosphor is 5 μm or more and 50 μm or less.

[5]

The β-sialon phosphor according to any one of the above [1] to [4], a ratio of the number of the primary particles to the number of secondary particles of the β-sialon phosphor is 1.90 or less.

[6]

A light emitting device including a light emitting light source and a wavelength conversion member, in which the wavelength conversion member contains a phosphor, and the phosphor contains the β-sialon phosphor according to any one of the above [1] to [5].

[7]

The light emitting device according to the above [6], in which the light emitting light source includes an LED chip that generates light having a wavelength of 300 nm to 500 nm.

[8]

The light emitting device according to the above [6] or [7], in which the phosphor further contains a manganese-solid-dissolved KSF-based phosphor.

EXAMPLES

Hereinafter, the present invention will be described with reference to Examples and Comparative Examples, but the present invention is not limited thereto.

Example 1

Using a V-type mixer (S-3 manufactured by Tsutsui Scientific Instruments Co., Ltd.), 95.80% by mass of an α-silicon nitride powder (SN-E10 grade, oxygen content 1.0% by mass) manufactured by Ube Industries, Ltd., 2.74% by mass of an aluminum nitride powder (F grade, oxygen content 0.8% by mass) manufactured by Tokuyama Corporation, 0.56% by mass of aluminum oxide powder (TM-DAR grade) manufactured by TAIMEI CHEMICALS Co., Ltd., and 0.90% by mass of a europium oxide powder (RU grade) manufactured by Shin-Etsu Chemical Co., Ltd. were mixed, and then the obtained mixture was passed through a sieve having a mesh size of 250 μm to remove agglomerates and obtain a first raw material mixed powder. The compounding ratio (referred to as first compounding composition (% by mass)) here was designed so that Z=0.22 is obtained by calculation from the Si/Al ratio, excluding europium oxide, in general formula of β-sialon:$Si_{6-z}Al_zO_zN_{8-z}$.

A cylindrical boron nitride container with a lid and having an inner diameter of 10 cm and a height of 10 cm was filled with 200 g of the obtained raw material powder having the first compounding composition, and a heat treatment (first firing step) was performed at 1950° C. for 10 hours in a pressurized nitrogen atmosphere of 0.8 MPa in an electric furnace having a carbon heater. The powder subjected to the heat treatment was pulverized by a supersonic jet crusher (PJM-80SP, manufactured by Nippon Pneumatic Mfg. Co., Ltd.), and then the obtained pulverized product was passed through a nylon sieve having a mesh size of 45 μm to obtain a first fired powder.

The obtained first fired powder and europium oxide powder (RU grade) manufactured by Shin-Etsu Chemical Co., Ltd. were compounded at a compounding ratio of 90:10 (referred to as the second compounding composition (% by mass)) and the first fired powder and the europium oxide powder were mixed using a V-type mixer (S-3 manufactured by Tsutsui Scientific Instruments Co., Ltd.). Subsequently, the obtained mixture was passed through a nylon sieve having a mesh size of 250 μm to remove agglomerates and obtain a second raw material mixed powder.

A cylindrical boron nitride container with a lid and having an inner diameter of 10 cm and a height of 10 cm was filled with 200 g of the obtained raw material powder having the second compounding composition, and a heat treatment (second firing step) was performed at 2020° C. for 12 hours in a pressurized nitrogen atmosphere of 0.8 MPa in an electric furnace having a carbon heater. The powder subjected to the heat treatment was pulverized by a supersonic jet crusher (PJM-80SP, manufactured by Nippon Pneumatic Mfg. Co., Ltd.), and then the obtained pulverized product was passed through a nylon sieve having a mesh size of 45 μm to obtain a second fired powder. The passing rate of the sieve was 92%.

A cylindrical boron nitride container with a lid and having an inner diameter of 5 cm and a height of 3.5 cm was filled with 20 g of the second fired powder, and an annealing treatment was performed at 1500° C. for 8 hours in an atmospheric pressure argon atmosphere in an electric furnace having a carbon heater. The powder subjected to the annealing treatment was subjected to acid treatment by immersing it in a 1:1 mixed acid of 50% hydrofluoric acid and 70% nitric acid at 75° C. for 30 minutes. The powder after the acid treatment was precipitated as it was, decantation for removing the supernatant liquid and fine powder was repeated until the pH of the solution was 5 or more and the supernatant liquid became transparent, and the finally obtained precipitate was filtered and dried to obtain a phosphor powder of Example 1.

As a result of powder X-ray diffraction measurement, it was found that the crystal phase present was a β-sialon single phase and a β-sialon phosphor was obtained. The Eu content measured by ICP emission spectroscopic analysis was 0.72% by mass.

Here, the first compounding composition and the second compounding composition in Example 1 are shown in Table 1.

<50% area diameter $D_{50}$, 10% area diameter $D_{10}$ and 90% area diameter $D_{90}$ obtained by EBSD>

The 50% area diameter $D_{50}$, the 10% area diameter $D_{10}$ and the 90% area diameter $D_{90}$ of the primary particles of the β-sialon phosphor of Example 1 were measured using an EBSD method. As the EBSD method, measurement was performed using an apparatus in which a scanning electron microscope (FE-SEM, JSM-7001F type manufactured by JEOL Ltd.) 2 was added with an electron backscatter diffraction image measuring apparatus (OIM device manufactured by EDAX-TSL) 3.

Specifically, the β-sialon phosphor of Example 1 was irradiated with an electron beam to cause scattering corresponding to the crystal structure and the crystal orientation, and the shape of the scattering pattern was analyzed by software (OIM, Ver 5.2 manufactured by EDAX-TSL) to identify the crystal orientation of the individual phosphor particles. Furthermore, the particle shape in each crystal orientation was image-analyzed, and from the above equations (1), (2) and (3), the 50% area diameter $D_{50}$ of the primary particle, the 10% area diameter $D_{10}$, and the 90% area diameter $D_{90}$ were calculated respectively. Furthermore, the number of primary particles in the secondary particles (ratio of the number of primary particles to the number of secondary particles of β-sialon) was calculated from the obtained image.

The measurement conditions for the crystal orientation obtained by the EBSD method are shown below.
 Acceleration voltage: 15 kV
 Working distance: 15 mm
 Sample tilt angle: 70°
 Measurement area: 80 μm×200 μm
 Step width: 0.2 μm
 Measurement time: 50 msec/step
 Number of data points: Approximately 400,000 points
 <Image Analysis>

Figure 3:
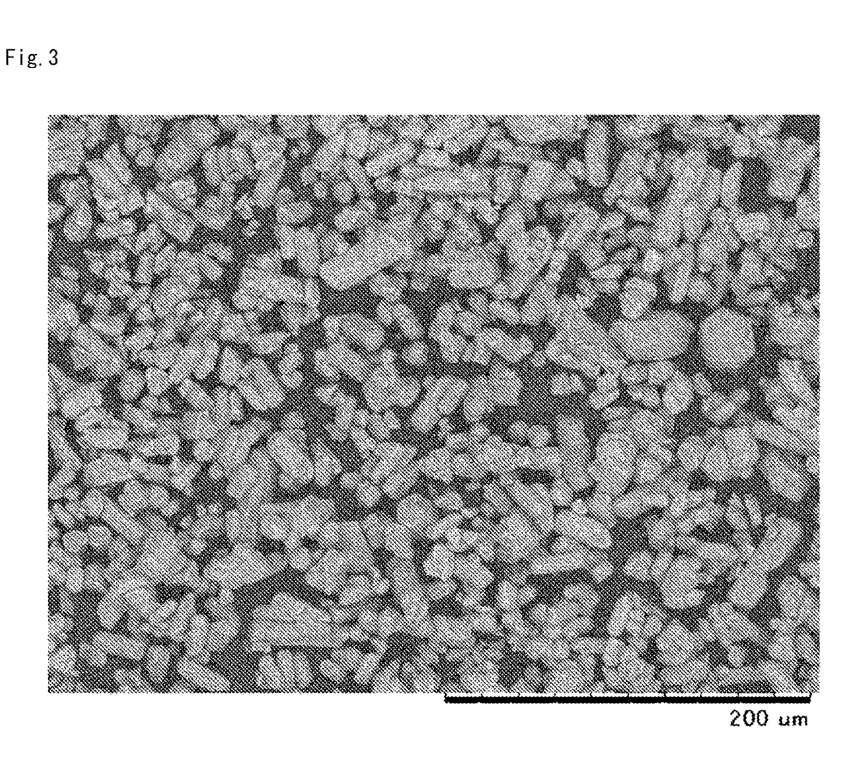
FIG. 3 is a view showing a scanning electron microscope image (SEM image) of a β-sialon phosphor of Example 1.
Figure 4:
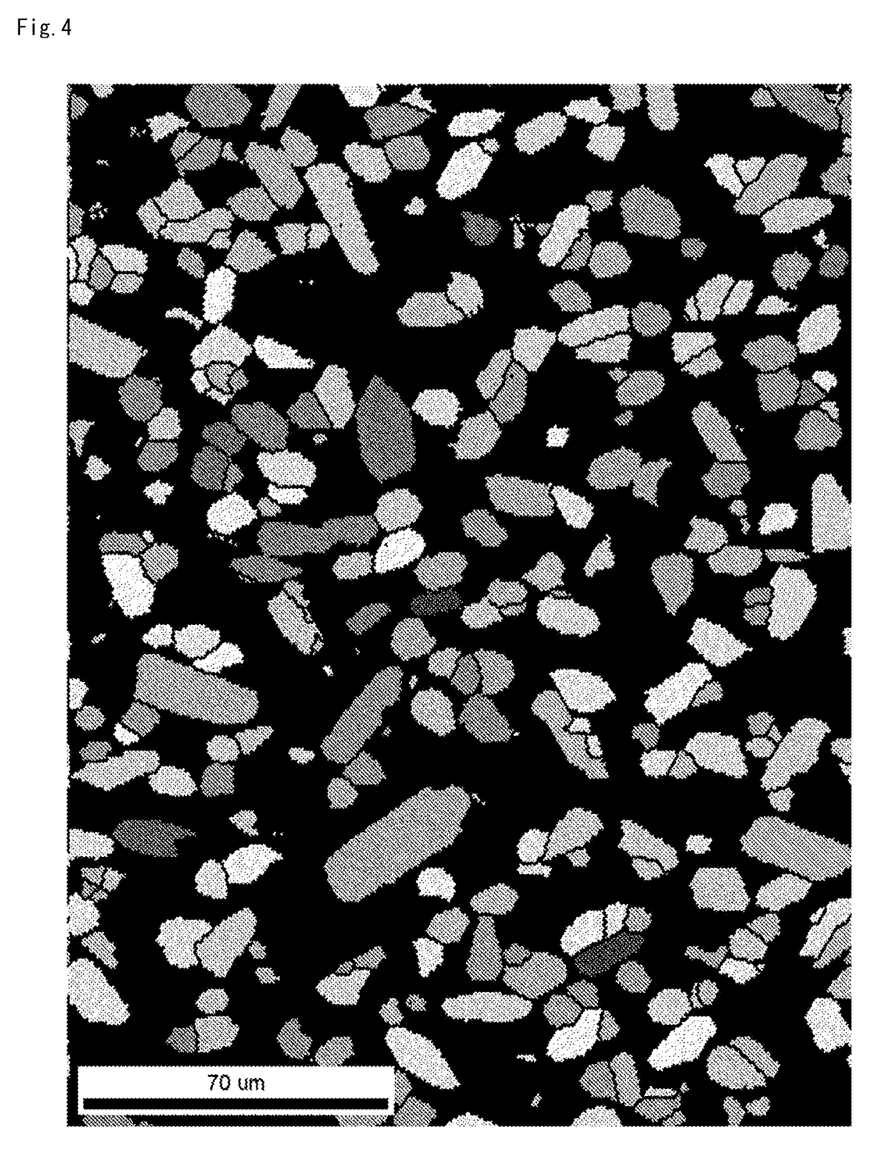
FIG. 4 is a view showing an EBSD image of the β-sialon phosphor shown in FIG. 3 by the EBSD method.

The image analysis was performed by producing the EBSD image of FIG. 4 from the β-sialon phosphor of Example 1 shown in the scanning electron microscope image of FIG. 3 (SEM image, electron acceleration voltage 15 kV, magnification 500). In FIG. 4, the portions other than the black background are the primary particles, and the lines shown inside the respective contours indicate the boundaries of the primary particles having different orientations. The larger the number of primary particles, the better the statistical analysis accuracy. When the number of primary particles is 3000 or more, sufficient data can be obtained for analysis.

The 50% area diameter $D_{50}$ of the primary particles of the β-sialon phosphor of Example 1 obtained by this image analysis, the 10% area diameter $D_{10}$ of the primary particles of the β-sialon phosphor, and the 90% area diameter $D_{90}$ of the primary particles of the β-sialon phosphor, $(D_{50}-D_{10})/D_{50}$, $(D_{90}-D_{10})/D_{50}$, and the ratio of the number of primary particles to the number of secondary particles of the β-sialon are shown in Table 2, respectively.

<$D_{V50}$ (50% Volume Diameter)>

The particle size distribution of the β-sialon phosphor of Example 1 was measured by a laser diffraction scattering method to obtain $D_{V50}$.

<Evaluation of Fluorescence Characteristics>

The fluorescence characteristics of the β-sialon phosphor were evaluated by the peak intensity and peak wavelength measured by the following methods.

As an apparatus, a spectrofluorometer (F-7000, manufactured by Hitachi High-Technologies Corporation) calibrated by the Rhodamine B method and a standard light source was used. A dedicated solid sample holder was filled with the obtained phosphor powder, and then the fluorescence spectrum when irradiated with excitation light dispersed at a wavelength of 455 nm was measured using a spectrofluorometer, and from the obtained fluorescence spectrum, the peak intensity and peak wavelength were obtained. The results obtained are shown in Table 2.

Since the peak intensity varies depending on the measuring apparatus and conditions, the unit is an arbitrary unit, and in each of Examples and Comparative Examples, the measurement was performed under the same conditions, and the β-sialon phosphors of each Example and Comparative Example were continuously measured and compared. Table 2 shows the peak intensities of the respective phosphors when the peak intensity of the β-sialon phosphor of Comparative Example 1 is set to 100%.

<CIE Chromaticity>

The CIE (Commission Internationale de l'Eclairage) chromaticity of the fluorescence spectrum was determined by measuring the emission spectrum of the total light flux obtained by collecting the fluorescence for excitation at 455 nm by using an integrating sphere in an instantaneous multi-photometry system (MCPD-7000, manufactured by Otsuka Electronics).

Examples 2 and 3

β-sialon phosphor powders were obtained by the same method as in Example 1 except that the second compounding composition was changed to the compounding ratio shown in Table 1. As a result of powder X-ray diffraction measurement of the obtained β-sialon phosphor, the crystal phase present in both was a β-sialon single phase.

Further, the same evaluation as in Example 1 was performed. The results obtained are shown in Table 1 and Table 2, respectively.

Comparative Example 1

A β-sialon phosphor powder was obtained in the same manner as in Example 1 except that the step corresponding to the second firing step of Example 1 was not carried out. As a result of powder X-ray diffraction measurement of the obtained β-sialon phosphor, the crystal phase present was a β-sialon single phase.

Further, the same evaluation as in Example 1 was performed. The results obtained are shown in Table 1 and Table 2, respectively.

Example 4

A β-sialon phosphor powder was obtained in the same manner as in Example 2 except that in the first firing step of Example 2, 5% by mass of the first fired powder of Example 2 was added and the first compounding composition was changed to the compounding ratio shown in Table 1.

Further, the same evaluation as in Example 1 was performed. The results obtained are shown in Table 1 and Table 2, respectively.

Comparative Example 2

A β-sialon phosphor powder was obtained in the same manner as in Example 4 except that the step corresponding to the second firing step of Example 4 was not carried out. As a result of powder X-ray diffraction measurement of the obtained β-sialon phosphor, the crystal phase present was a β-sialon single phase.

Further, the same evaluation as in Example 1 was performed. The results obtained are shown in Table 1 and Table 2, respectively.

Example 5

A β-sialon phosphor powder was obtained in the same manner as in Example 2 except that the pulverization conditions were adjusted to obtain a smaller particle size.

Further, the same evaluation as in Example 1 was performed. The results obtained are shown in Table 1 and Table 2, respectively.

Comparative Example 3

A β-sialon phosphor powder was obtained in the same manner as in Example 5 except that the step corresponding to the second firing step of Example 5 was not carried out. As a result of powder X-ray diffraction measurement of the obtained β-sialon phosphor, the crystal phase present was a β-sialon single phase.

Further, the same evaluation as in Example 1 was performed. The results obtained are shown in Table 1 and Table 2, respectively.

TABLE 1

| | First compounding composition (% by mass) | | | | | Second compounding composition (% by mass) | | | | Composition (% by mass) |
|---|---|---|---|---|---|---|---|---|---|---|
| | $Si_3N_4$ | AlN | $Al_2O_3$ | first $Eu_2O_3$ | β-sialon powder | first fired powder | $Si_3N_4$ | AlN | $Al_2O_3$ | second $Eu_2O_3$ | Eu |

| | $Si_3N_4$ | AlN | $Al_2O_3$ | first $Eu_2O_3$ | β-sialon powder | first fired powder | $Si_3N_4$ | AlN | $Al_2O_3$ | second $Eu_2O_3$ | Eu |
|---|---|---|---|---|---|---|---|---|---|---|---|
| Example 1 | 95.80 | 2.74 | 0.56 | 0.90 | 0.00 | 90.00 | — | — | — | 10.00 | 0.72 |
| Example 2 | 95.80 | 2.74 | 0.56 | 0.90 | 0.00 | 95.00 | — | — | — | 5.00 | 0.67 |
| Example 3 | 95.80 | 2.74 | 0.56 | 0.90 | 0.00 | 99.00 | — | — | — | 1.00 | 0.71 |
| Example 4 | 91.01 | 2.60 | 0.53 | 0.86 | 5.00 | 95.00 | — | — | — | 5.00 | 0.70 |
| Example 5 | 95.80 | 2.74 | 0.56 | 0.90 | 0.00 | 95.00 | — | — | — | 5.00 | 0.66 |
| Comparative Example 1 | 95.80 | 2.74 | 0.56 | 0.90 | 0.00 | | | | | | 0.78 |
| Comparative Example 2 | 91.01 | 2.60 | 0.53 | 0.86 | 5.00 | | | | | | 0.77 |
| Comparative Example 3 | 95.80 | 2.74 | 0.56 | 0.90 | 0.00 | | | | | | 0.75 |

TABLE 2

| | Example 1 | Example 2 | Example 3 | Example 4 | Example 5 | Comparative Example 1 | Comparative Example 2 | Comparative Example 3 |
|---|---|---|---|---|---|---|---|---|
| 10% area average diameter $D_{10}$ [μm] | 5.3 | 5.0 | 5.0 | 6.9 | 3.8 | 3.1 | 4.1 | 2.4 |
| 50% area average diameter $D_{50}$ [μm] | 9.9 | 9.2 | 10.1 | 14.4 | 7.3 | 6.8 | 10.8 | 4.9 |
| 90% area average diameter $D_{90}$ [μm] | 18.3 | 15.2 | 15.9 | 25.2 | 12.0 | 13.1 | 17.0 | 7.7 |
| $(D_{50} - D_{10})/D_{50}$ | 0.46 | 0.45 | 0.51 | 0.51 | 0.48 | 0.54 | 0.63 | 0.52 |
| $(D_{90} - D_{10})/D_{50}$ | 1.31 | 1.11 | 1.08 | 1.30 | 1.13 | 1.48 | 1.20 | 1.07 |
| $D_{v50}$ [μm] | 19.1 | 19.2 | 19.8 | 25.2 | 11.1 | 18.0 | 23.8 | 15.2 |
| Ratio of primary particles to secondary particles [—] | 1.54 | 1.30 | 1.48 | 1.54 | 1.40 | 2.00 | 1.98 | 2.06 |
| Light emission peak intensity (%) | 113 | 110 | 112 | 115 | 109 | 100 | 94 | 97 |
| Light emission peak wavelength (nm) | 543 | 544 | 544 | 545 | 543 | 543 | 543 | 543 |
| Chromaticity x | 0.367 | 0.368 | 0.371 | 0.371 | 0.367 | 0.362 | 0.360 | 0.361 |
| Chromaticity y | 0.616 | 0.615 | 0.612 | 0.613 | 0.615 | 0.619 | 0.621 | 0.620 |

From Table 2, it can be seen that the β-sialon phosphors of Examples 1 to 5 had a higher fluorescence peak intensity than the β-sialon phosphors of Comparative Examples 1 to 3, and β-sialon phosphors having high luminance were obtained.

This application claims priority on the basis of Japanese Patent Application No. 2018-216183 filed on Nov. 19, 2018, the entire disclosure of which is incorporated herein by reference.

The invention claimed is:

1. A β-sialon phosphor that is a solid solution of europium,
wherein, when single-crystal particles distinguished for each crystal orientation by identifying the crystal orientation of individual particles of the β-sialon phosphor by an electron backscatter diffraction image method are defined as primary particles, $D_{50}$ is 7.0 μm or more and 20.0 μm or less and $(D_{50}-D_{10})/D_{50}$ is 0.60 or less, where $D_{50}$ is a 50% area diameter of the primary particles of the β-sialon phosphor, and $D_{10}$ is a 10% area diameter of the primary particles of the β-sialon phosphor, when a cross-sectional area of the primary particles is determined by image analysis.

2. The β-sialon phosphor according to claim 1, wherein $(D_{90}-D_{10})/D_{50}$ is 1.45 or less, where $D_{90}$ is a 90% area diameter of the primary particles of the β-sialon phosphor.

3. The β-sialon phosphor according to claim 1, wherein the β-sialon phosphor is represented by general formula $Si_{6-z}Al_zO_zN_{8-z}$: $Eu^{2+}$ (0<Z≤4.2).

4. The β-sialon phosphor according to claim 1, wherein a $D_{v50}$ particle size (diameter at 50% cumulative volume in particle size distribution by a laser diffraction scattering method in accordance with JIS R1629: 1997) of the β-sialon phosphor is 5 μm or more and 50 μm or less.

5. A light emitting device comprising a light emitting light source and a wavelength conversion member,
- wherein the wavelength conversion member contains a phosphor, and
- the phosphor contains the β-sialon phosphor according to claim 1.

6. The light emitting device according to claim 5,
- wherein the light emitting light source includes an LED chip that generates light having a wavelength of 300 nm to 500 nm.

7. The light emitting device according to claim 5,
- wherein the phosphor further contains a manganese-solid-dissolved KSF-based phosphor.

* * * * *